(12) United States Patent
Tsu et al.

(10) Patent No.: US 10,374,037 B2
(45) Date of Patent: Aug. 6, 2019

(54) INCOHERENT TYPE-III MATERIALS FOR CHARGE CARRIERS CONTROL DEVICES

(71) Applicants: Raphael Tsu, Huntersville, NC (US); Ian T. Ferguson, Davidson, NC (US); Nikolaus Dietz, Tucker, GA (US)

(72) Inventors: Raphael Tsu, Huntersville, NC (US); Ian T. Ferguson, Davidson, NC (US); Nikolaus Dietz, Tucker, GA (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 99 days.

(21) Appl. No.: 14/759,478

(22) PCT Filed: Feb. 27, 2014

(86) PCT No.: PCT/US2014/019032
§ 371 (c)(1),
(2) Date: Jul. 7, 2015

(87) PCT Pub. No.: WO2014/134310
PCT Pub. Date: Sep. 4, 2014

(65) Prior Publication Data
US 2015/0340439 A1   Nov. 26, 2015

Related U.S. Application Data

(60) Provisional application No. 61/770,037, filed on Feb. 27, 2013.

(51) Int. Cl.
*H01L 29/06* (2006.01)
*H01L 29/15* (2006.01)
(Continued)

(52) U.S. Cl.
CPC .......... *H01L 29/0688* (2013.01); *H01L 29/15* (2013.01); *H01L 29/205* (2013.01);
(Continued)

(58) Field of Classification Search
CPC ... H01L 29/205; H01L 29/267; H01L 29/778; H01L 31/03046; H01L 31/03048
See application file for complete search history.

(56) References Cited

U.S. PATENT DOCUMENTS 4,163,237 A * 7/1979 Dingle ............. H01L 21/02461
257/20
4,482,779 A * 11/1984 Anderson ............. H01L 31/062
136/255

(Continued)

FOREIGN PATENT DOCUMENTS

EP   2 405 037 A1   1/2012
JP   2000-114594 A   4/2000

OTHER PUBLICATIONS

Collazo et al. "The Group III-Nitride Material Class: from Preparation to Perspectives in Photoelectrocatalysis," chapter 8 of "Photoelectrochemical Water Splitting: Issues and Perspectives," ed. H-J. Lewerenz and L.M. Peter, RSC Publishing (2013).*

(Continued)

*Primary Examiner* — Cuong Q Nguyen
*Assistant Examiner* — Shih Tsun A Chou
(74) *Attorney, Agent, or Firm* — Oliff PLC; R. Brian Drozd

(57) ABSTRACT

A semiconductor junction may include a first semiconductor material and a second material. The first and the second semiconductor materials are extrinsically undoped. At least a portion of a valence band of the second material has a higher energy level than at least a portion of the conduction band of the first semiconductor material (type-III band (Continued)

E-distance band profile diagram of incoherent type-II structures with periodic inserted 2DILs alignment). A flow of a majority of free carriers across the semiconductor junction is diffusive. A region of generation and/or recombination of a plurality of free carriers is confined to a two-dimensional surface of the second material, and at the interface of the first semiconductor material and the second material.

9 Claims, 5 Drawing Sheets

(51) Int. Cl.
    *H03K 3/011*     (2006.01)
    *H01L 29/267*     (2006.01)
    *H01L 29/205*     (2006.01)
    *H01L 31/0304*     (2006.01)
    *H01L 31/0352*     (2006.01)
    *H01L 29/20*     (2006.01)

(52) U.S. Cl.
    CPC ...... *H01L 29/267* (2013.01); *H01L 31/03044* (2013.01); *H01L 31/035236* (2013.01); *H03K 3/011* (2013.01); *H01L 29/2003* (2013.01); *Y02E 10/544* (2013.01)

(56) References Cited

U.S. PATENT DOCUMENTS

| | | | |
|---|---|---|---|
| 5,059,545 A * | 10/1991 | Frensley | H01L 29/7606 257/E29.241 |
| 5,144,378 A * | 9/1992 | Hikosaka | H01L 29/205 257/194 |
| 5,302,840 A | 4/1994 | Takikawa | |
| 7,177,515 B2 | 2/2007 | Estes et al. | |
| 7,180,066 B2 | 2/2007 | Qiu | |
| 8,853,526 B2 | 10/2014 | Kostecki et al. | |
| 8,917,014 B2 | 12/2014 | Veerasamy | |
| 9,105,791 B1 | 8/2015 | Dyer et al. | |
| 2002/0167023 A1* | 11/2002 | Chavarkar | H01L 29/7783 257/194 |
| 2003/0102482 A1* | 6/2003 | Saxler | H01L 29/7783 257/85 |
| 2004/0155260 A1 | 8/2004 | Kuzmik | |
| 2005/0006639 A1* | 1/2005 | Dupuis | H01L 21/02378 257/20 |
| 2005/0117618 A1* | 6/2005 | Tredicucci | B82Y 20/00 372/45.01 |
| 2008/0087326 A1 | 4/2008 | Scholes et al. | |
| 2010/0163798 A1* | 7/2010 | Ryowa | C09K 11/02 252/301.4 R |
| 2010/0261263 A1* | 10/2010 | Vo-Dinh | A61L 2/08 435/287.1 |
| 2010/0270591 A1* | 10/2010 | Ahn | H01L 29/7782 257/194 |
| 2011/0193092 A1 | 8/2011 | Passlack | |
| 2011/0291109 A1* | 12/2011 | Wraback | H01L 31/1075 257/77 |
| 2012/0119205 A1 | 5/2012 | Taniguchi et al. | |
| 2012/0161098 A1* | 6/2012 | Hiura | C23C 16/0218 257/9 |
| 2012/0186641 A1* | 7/2012 | Sharps | H01L 31/0687 136/255 |
| 2012/0299011 A1* | 11/2012 | Hikita | H01L 29/7783 257/76 |
| 2014/0071316 A1 | 3/2014 | Asano et al. | |
| 2017/0098716 A1 | 4/2017 | Li et al. | |

OTHER PUBLICATIONS

Wei "III-Nitride Semiconductors for Photovoltaic Applications" National Renewable Energy Laboratory (2003).*
"Semiconductor Heterojunctions," The University of Toledo, Department of Physics and Astronomy (2012).*
Stadelmann, "Antidot Superlattices in InAs—GaSb Double Heterostructures: Transport Studies," Ph.D. Thesis, University College, Oxford, 2006.*
Nguyen et al. "Surface donor contribution to electron sheet concentrations in not-intentionally doped InAs—AlSb quantum wells," Appl. Phys. Lett. 60 (15), Apr. 13, 1992, p. 1854.*
Unlu et al., Band offsets in III-nitride heterostructures, J. Phys. D: Appl. Phys. 35 (2002) 591-594.*
Ghezzi et al., Determination of the valence band offset of MOVPE-grown In0.48Ga0.52P/GaAs multiple quantum wells by admittance spectroscopy, Physical Review B 77, 125317 (2008).*
Zhang et al., Band alignment of InN/GaAs heterojunction determined by x-ray photoelectron spectroscopy, Applied Physics Letters 93, 122111 (2008).*
Herbert Kroemer, Nobel Lecture: Quasielectric fields and band offsets: teaching electrons new tricks, Reviews of Modern Physics, vol. 73, Jul. 2001.*
Mikhailova et al., Interface-induced optical and transport phenomena in type II broken-gap single heterojunctions, Semicond. Sci. Technol. 19, 2004, R109-R128.*
Pryor et al., Band-edge diagrams for strained III-V semiconductor quantum wells, wires, and dots, Physical Review B 72, 205311 (Year: 2005).*
U.S. Appl. No. 15/203,458, filed Jul. 6, 2016.
Sep. 1, 2015 International Preliminary Report on Patentability issued in International Patent Application No. PCT/US2014/019032.
Feb. 26, 2016 Written Opinion issued in Singapore Patent Application No. 11201508691R.
Jun. 12, 2014 Search Report issued in International Application No. PCT/US2014/019032.
"5.3.1 Ideal Heterojunctions;" Dec. 31, 2011; retreived from https://web.archive.org/web/20111231132923/http:/www.tf.uni-kiel.de/matwis/amat/semi_en/kap_5/backbone/r5_3_1.html.
"Heterojunction Band Alignment;" Apr. 28, 2012; retreived from https://web.archive.org/web/20120428221418/http:/www.utdallas.edu/~frensley/technical/hetphys/node7.html.
"2.2.4 Simple Junctions and Devices;" Dec. 30, 2011; retreived from https://web.archive.org/web/20111230122847/http:/www.tf.uni-kiel.de/matwis/amat/semi_en/kap_2/backbone/r2_2_4.html.
Aug. 19, 2016 Written Opinion issued in Singapore Patent Application No. 11201508691R.
Oct. 11, 2016 Search Report issued in European Patent Application No. 14756491.8.
Baranov et al; "Observation of room-temperature laser emission from type III InAs/GaSb multiple quantum well structures;" Applied Physics Letters; vol. 71; No. 6; Aug. 11, 1997; pp. 735-738.
Yin et al; "Synthesis of InN/InP core/sheath nanowires;" Applied Physics Letters; vol. 84; No. 9; Mar. 1, 2004; pp. 1546-1548.
Sep. 29, 2016 Office Action issued in Canadian Patent Application No. 2,915,930.
Oct. 25, 2016 International Preliminary Report on Patentability issued in International Patent Application No. PCT/US2015/027789.
Feb. 2, 2017 Examination Report issued in Singaporean Patent Application No. 11201508691R.
Aug. 23, 2017 Office Action issued in Canadian Patent Application No. 2,915,930.
Aug. 2, 2018 Office Action issued in U.S. Appl. No. 15/203,458.

* cited by examiner

E-distance band profile diagram of incoherent type-II structures with periodic inserted 2DILs E-k dispersion diagram band of an incoherent type-II super lattice structure

US 10,374,037 B2

INCOHERENT TYPE-III MATERIALS FOR CHARGE CARRIERS CONTROL DEVICES

CROSS-REFERENCE TO RELATED APPLICATION

This application claims priority to co-pending provisional patent application 61/770,037, filed Feb. 27, 2013, the disclosure of which is hereby incorporated in its entirety.

BACKGROUND

Advances in solid state electronics over the last half-century have been predicated predominantly on improvements to and specialization of p-n junction based devices. Such improvements have been aimed at every aspect of device performance, from increased efficiency and yield to optimized frequency response, minimized noise, and more. Common p-n junction based devices include diodes, transistors, triodes, LED's (including OLED's), etc. Such p-n junction based devices form the core of the modern electronics industry.

However, the elemental p-n junction has some fundamental and unavoidable drawbacks, some of which stem from the physical p-n junction itself. For example, the p-n junction requires the extrinsic doping of intrinsically electrically neutral semiconductor material with positive or negative ions to create the respective p- or n-type materials forming the junction. Such doping is expensive, can damage the semiconductor lattice, and increases scattering centers that can decrease carrier mobility and increase resistance. Further drawbacks of traditional p-n junction devices owe to subtleties in the physical motions of carriers within the junction, p-n band structure, and more, leading to various problems in creating exceptionally high-conductivity, high current, high power, and high frequency devices. Finally, PN junctions may be limited by the solid solubility of their constituent materials.

INDEX OF TERMS

GAIN: GAIN generally refers to a group III-nitride alloy, which multinary composition is circumscribed by the group III-nitride binaries boron nitride (BN), aluminum nitride (AlN), gallium nitride (GaN), indium nitride (InN), or thallium nitride (TlN). A GAIN heterostructure or multiple quantum well structure is a compositional tailored material stack where the composition of each layer (e.g. ternary alloys such as InGaN, InAlN, GaAlN, etc.) establishes a unique interface barrier (for free carriers, photons, phonons, etc.) to the next layer. A periodic repetition of such a stack may establish a new physical structure as for example explored in photonic crystals or meta-materials. GAIN is often referred to herein as the matrix (bulk) structure in which two-dimensional interlayers may be formed, although the matrix can also be formed of other materials.

2DIL: 2DIL is a two-dimensional interlayer embedded within a GAIN matrix, such as InGaP. In an embodiment, a GAIN-2DIL interface is proposed as an alternative to a traditional p-n interface. An interlayer may also be referred to as a delta-layer.

Ternary group III-Nitride: Three-element group III-Nitride, such as InGaN or AlInN alloys are composed between two group III-nitride binaries specified in [0010].

Quaternary group III-nitride: Four-element group III-Nitride, such as AlGaInN alloys are composed between three group III-nitride binaries specified in [0010].

QW/MQW: quantum well/multiple quantum well
SL: superlattice
PV: photovoltaic
IR/IR region: infrared/infrared region
HEMT: high-electron mobility transistor
MOCVD: metal-organic chemical vapor deposition, also abbreviated as OMCVD, OMVPE, OMVPD, or MOVPE.
MEPA-MOCVD: migration enhanced, plasma assisted metal-organic chemical vapor deposition.

SUMMARY

As mentioned above, PN junctions, the backbone of most semiconductor devices, needs doping, limited by solid solubility, as well as the introduction of increased carrier scattering. Doping results in a building voltage depending on doping levels. The consequence is that PN-junction devices cannot be operative below the build-in voltage.

In the present Incoherent Type-III (hereinafter referred to as "IT3") junction, equilibrium is reached when the two sides are aligned. Therefore, the junction is at zero-voltage, allowing operation as a rectifying junction at a very low voltage. Whereas the PN-junction has a build-in voltage determined by doping. If a PN-junction needs to be operated as a rectifying device, a minimum voltage is needed determined by the doping concentration which determines the power level of rectification. All of that is relaxed in the presently-disclosed IT3-Junction.

Additionally, high conducting regions are mostly used as in-between the metallic wires and individual devices to avoid the formation of Schottky barriers. IT3-junction serves as connections to devices, avoiding the formation of Schottky barriers.

The high level of conducting carriers can be used to fill in the range of operation in between metallic and doped semiconductors. Embodiments of this disclosure are provided below in more detail.

In some embodiments, a semiconductor structure is proposed which could alleviate many of the above-noted problems. Some physical applications of this structure might be:
- Material structures for high current, high carrier mobility for implementation in next generation high power devices, switches, and more;
- Unique nonlinear optical devices, which structures are based on vertically engineered materials (e.g. meta-materials) with controlled period anisotropic dielectric properties, interfacial polarities, and free carrier concentration modulations, having tunable external field nonlinearities;
- Nonlinear optical devices based on 2-dimensional or 3-dimensional confined waveguide structures, with induced nonlinearity modulation and control attributable to interfacial polarities and free carrier concentration modulations;
- Nanophotonic emitter/sensor elements based on surface plasmon generation on semiconductor-metal/dielectric-metal interfaces. One immediate application of these could be in vertical integrated nanoplasmonic devices required to form the optical interconnects of vertical integrated electronics; and
- High power Si-rectifiers (SCR: Silicon control rectifier).

In one aspect, a semiconductor junction may include a first semiconductor material and a second material. The first and the second semiconductor materials are extrinsically undoped. At least a portion of a valence band of the second material has a higher energy level than at least a portion of the conduction band of the first semiconductor material (type-III band alignment). A flow of a majority of free carriers across the semiconductor junction is diffusive. A region of generation and/or recombination of a plurality of free carriers is confined to a two-dimensional surface of the second material, and at the interface of the first semiconductor material and the second material.

Some embodiments are explicitly described herein but it should be known that other embodiments are within the scope of the present invention and the present invention should not be limited to the embodiments discussed herein.

DETAILED DESCRIPTION OF THE EMBODIMENTS

Figure 1:
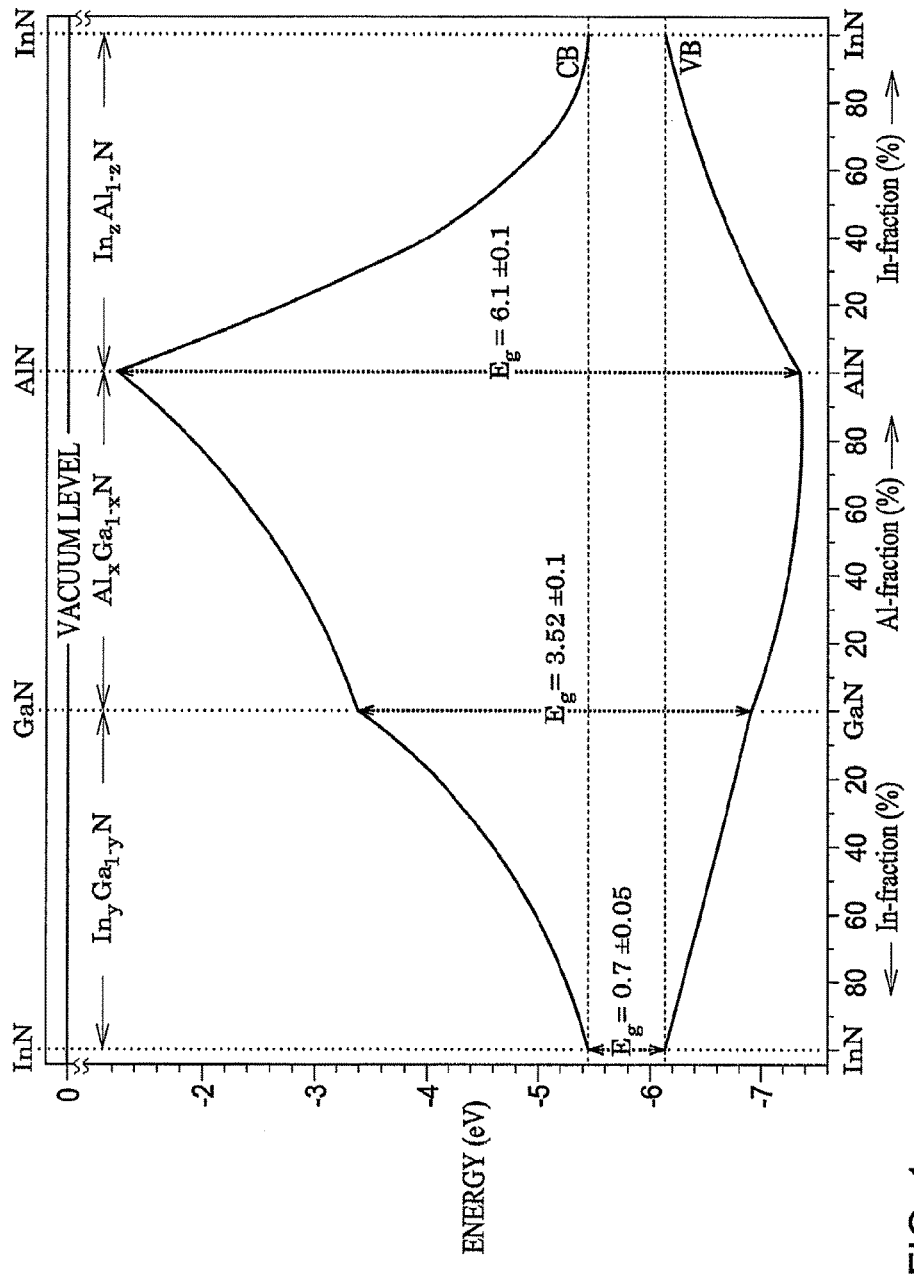
FIG. 1 shows an example of valence band position and offsets for group III-nitrides alloys.

Embodiments of the present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The terminology used herein is for the purpose of describing particular embodiments only and is not intended to be limiting of the invention.

As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

A high level description of general embodiments is provided briefly below. In describing such embodiments, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In some embodiments, this disclosure relates to the research into material structures capable of providing high currents and improved carrier mobility. This effect can be achieved by replacing traditional p-n carrier junctions, formed by extrinsic dopants of extended material regions, with unique semiconductor layer alignments that naturally form sharp interface p-n junctions by the diffusive transport of free carriers over the interface. Because this approach can result in the natural emergence of free carriers from the intrinsic semiconductor alloys at the junction interface, this approach may not introduce the scattering centers that traditionally result from implanting charged carriers (dopants) or the lattice damage sustained therefrom, each of which tends to reduce free carrier mobility. That is, high carrier concentration can be achieved by diffusive carrier transfer, but carrier scattering due to the Coulomb scattering from dopants may be avoided, leading to higher carrier mobility even with high carrier concentration. Thus, some embodiments describe various material structures that could provide for high current with higher mobility, which has tremendous utility in a variety of electronics applications.

Aspects of an embodiment include incorporating principles of incoherent type-III materials and device structures, such as combining dissimilar semiconductor alloys on a nanoscale to control the spatial conductivity of one- or two-dimensional (1D-/2D-) materials region without extrinsically doping either alloy. Exemplary systems illustrating the principle may include: i) incoherent GAlN (GAlN=e.g. group III-nitride heterostructures or multiple quantum wells) with insertion of 2DIL (2DIL=2-dimensional interlayer) of InGaP; (ii) indium-rich InGaN Multi-Quantum-Well (MQW) structures with embedded InGaP delta layers; or (iii) gallium-rich GaInN Multi-Quantum-Well (MQW) structures with embedded graphite delta layers; to name just a few.

According to an embodiment, the layers within the overall semiconductor structure can be selected and tailored such the valence band of an embedded delta-layer is above (of higher energy than) the conduction band of the surrounding matrix material, which by itself can be engineered as a 1D- or 2D-superlattice (SL) or multiple quantum well (MQW) structure (denoted as IT3 heterostructure). This selective engineering allows for the diffusive transport of free carrier over the interface formed by the two structures, creating high-conductive and high-mobility charge carrier (electrons as well as holes) transfer regions as well as p-n junctions without requiring extrinsic doping.

The diffusive carrier transport over the interface is a consequence of the short electron coherent length relative to the semiconductor structure. By creating regions relatively larger than the electronic wavefunctions of the free carriers, electron phase coherence is not maintained. The result is that quantum mechanical effects deriving from wavefunction coherence, such as quantum mechanical tunneling, may be suppressed, resulting in predominantly diffusive, 'classical' free carrier motion. However, the suppression of phase coherence may not adversely affect frequency response, since the collision frequency may still be high.

Unlike many related art devices, the IT3 structures for high-conductive and high mobility free carrier transport do not necessarily rely on a periodic superlattice (SL) structure for the generation of the free carriers and/or spatial confinement and transport. Instead, some embodiments can enable the integration of multiple, highly conductive interlayers for hole- and electron transport by tailoring the overlap of valance and conduction bands of adjacent, dissimilar materials without structural material degradation or reduction in transport carrier mobility. The electronic, optical and magnetic properties of such materials structures can lead to new device elements, replacing traditional p-n-junction devices, optoelectronic and even magneto-optic confinement and/or propagation structures. Some aspects may also provide a pathway to solve other presently encountered lattice-mismatch related problems that limit the material quality, and could offer insight into the integration of dissimilar materials, such as ternary/quaternary III-nitrides.

For example, "GAIN-2DIL-GAIN" SL structures may introduce period alternative layers for electron-/hole-transport. The carrier concentration in each layer of the "GAIN-2DIL-GAIN" SL structure can be tailored by both the valence band/conduction band offset at the GAIN-2DIL interface and the thicknesses of the layers. Each of these factors, in turn, may be controlled during fabrication, via the composition and deposition processes, respectively. Further, the GAIN structure by itself can be very complex, and may even have other device elements embedded within it, such as multiple quantum wells (MQW), waveguide elements for optical and magnetic confined interlayers, or laterally structured areas. Some of the potential applications are:

- Electronic devices with parallel higher current transport with high-mobility. Devices with this parallel capability can result from connecting the ends of the electron-/hole-conducting layers within the "GAIN-2DIL-GAIN" SL structures together. Some useful applications could be in high-power switches, light emitters, and multi junction photovoltaic concentrator cells.
- Environmentally sensitive infrared (IR) and/or quasi-optical sensors and emitters. "GAIN-2DIL-GAIN" SL structures can be transparent in the IR region, and are highly nonlinear/anisotropic, with the nonlinearity controlled through free carriers (electrons/holes) as well as external electromagnetic (EM) fields. Accordingly, photons in the region of transparency (IR photons) may be ready emitted and detected.
- Vertical integrated processors and 3-dimensional memory elements. Some "GAIN-2DIL" elements are based on dissimilar integrated semiconductor materials, such as InGaN and InGaP, and may each be transparent in the near-, mid- and far-IR regime. The absorption in this regime can be controlled by the plasma frequency of the carriers and the lattice vibration modes of the "GAIN-2DIL" structure. Thus, unlike metal-based interlayers, these elements can have transparency regions for optical interconnections between vertically integrated device elements.
- Nanophotonic emitters/sensors. "GAIN-2DIL" elements may be designed to have very large numbers of interfacial free carriers (for example, $\sim 10^{20}$-$10^{23}$). By using the nanoplasmonic effect on the dielectric-metal (2DIL-GAIN) interfaces on lateral structured interlayers, nanophotonic device elements may be engineered to act as emitters/sensors in various vertical integrated devices.

More detailed descriptions of some embodiments are provided below.

Group III-nitride (TlN—InN—GaN—AlN—BN) compound semiconductors can exhibit unique optoelectronic and magneto-optical properties, often superior to currently utilized and mature group III-arsenide/III-phosphide alloys. The progress in group III-nitride materials development over the last 20 years has enabled the fabrication of devices in the areas of electronics (e.g. high power HEMTs, etc.) and optoelectronics (e.g. LEDs, lasers, radiation hardened magneto/optoelectronics, spectral tailored detectors, or advanced high speed optoelectronics). This provides a glimpse of the hidden potential buried in ternary and quaternary group III-nitride alloys, in which conduction band/valence band gap energies may be expressly tailored to have precise energy values ranging from the infrared (0.7 eV) to the ultraviolet (6 eV). As depicted in FIG. 1, the valance bands (VB) and conduction bands (VC) can be engineered over this wide energy range, allowing the energetic alignment of ternary III-nitride semiconductor bands. The band-alignment depicted in FIG. 1 indicates that the formation of group III-nitride superlattice (SL) or multiple quantum well (MQW) structures can have type-I or type-II free carrier confinements. However, interfacial polarization fields may shift the distribution of electrons and holes within the multiple quantum well (MQW) region, and this can be controlled accordingly.

Advanced device structures that require precise tailored superlattices (SLs) or multiple quantum wells (MQWs) over a large composition range may be high-efficiency spectrally-agile (i.e., tunable) light sources, multifunctional environment-sensitive and radiation hardened sensors, or multijunction photovoltaic (PV) solar cells. These are some areas of application that may contribute significantly towards the reduction of global energy consumption and increased utilization of renewable energy sources.

In order to further unlock the full potential of ternary or quaternary group III-nitride alloys and enable their integration into existing systems, new approaches to the fabrication of semiconductor alloys from dissimilar lattices (i.e., composed from three or four different elements) are actively being sought. The solutions to these problems may be provided by the same technologies employed in embodiments discussed herein. Some examples of such problems could be lattice strain, interfacial polarization fields, and incompatible partial pressures. These problems can generally limit the formation, material quality and efficiency of ternary/quaternary III-nitrides, and may directly impact efficient free carrier (electrons and holes) confinement, and extraction and/or current injection in high-power and/or multi-junction device elements.

Some embodiments of the present invention present IT3 structures for high-conductive and high mobility free carrier transport elements. Classical type-II or IT3 superlattice (SL) structures are formed with band alignments resulting in the confinement of electrons and holes to different zones, or by semiconductors and zero-gap semiconductor superlattice (SL) structures, respectively. Both may rely on a tailored period semiconductor superlattice (SL) structure that generates a new spatial confinement and effective mass for electron and hole transport, typically exploited for IR-detectors, spin-transport, or for tailoring the effective mass.

In various embodiments described herein, IT3 structures are introduced. IT3 structures are distinct different from the coherent type-II/III superlattice (SL) structures discussed above, and do not rely on a periodic superlattice (SL) structure for the generation of the free carriers and/or spatial confinement and transport. IT3 structures may be formed, for instance, by the insertion of a 2-dimensional interlayer (2DIL) into a group III-nitride heterostructures or group III-nitride multiple quantum well (collectively, GAIN), such that the valence band of the 2DIL is above the conduction band of the GAIN. The thickness of the 2DIL structure may be very small, on the order of a few monolayers (MLs), but may be as high as 100 monolayers. The GAIN thickness, in contrast, may vary from a 1 nm to 500 nm, depending in the complexity of the GAIN structures (e.g. group III-nitride layer, MQWs or SLs). As detailed below, such arrangements allow for the diffusive transport of free carriers over the interface formed by 2DILs and GAINs, creating high-conductive and high-mobility charge carrier (electrons and holes) transfer regions as well as p-n junctions without requiring extrinsic dopant.

Figure 3B:
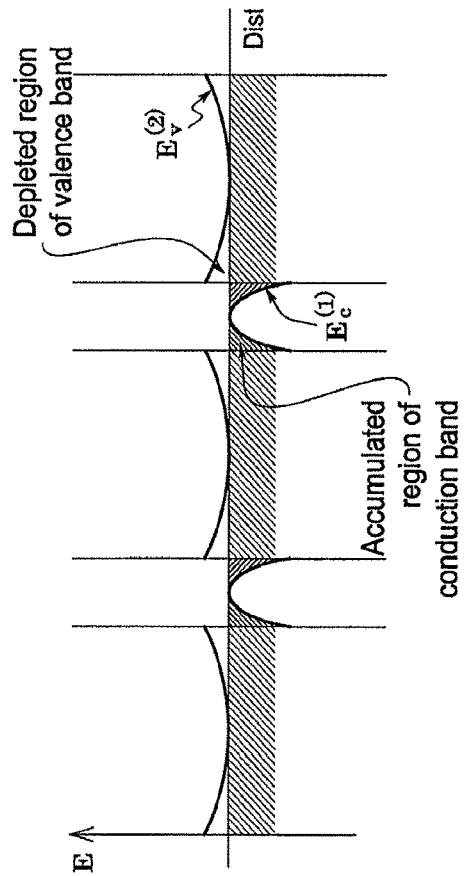
FIG. 3b shows E-distance band profile diagram of incoherent type-III (IT3) structures with periodic inserted 2DILs (as described herein)
Figure 3A:
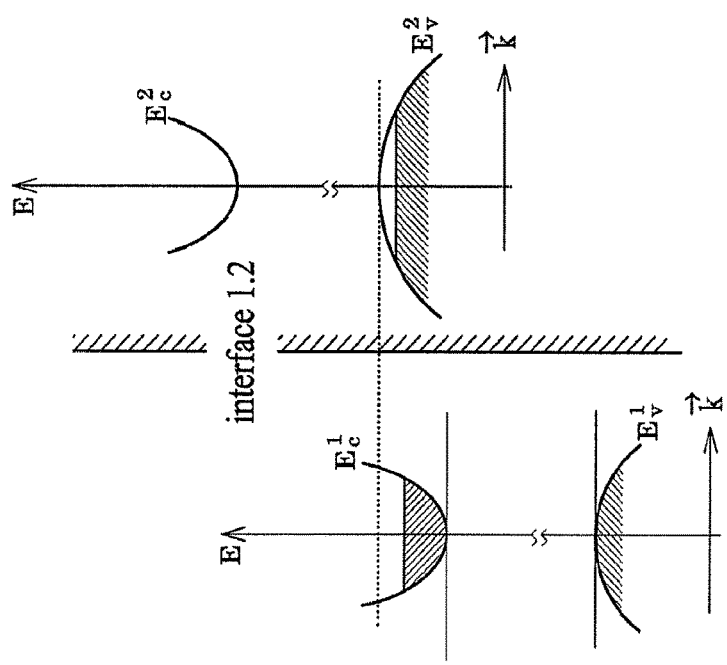
FIG. 3a presents an E-k dispersion diagram band of an incoherent type-III (IT3) super lattice structure.
Figure 4:
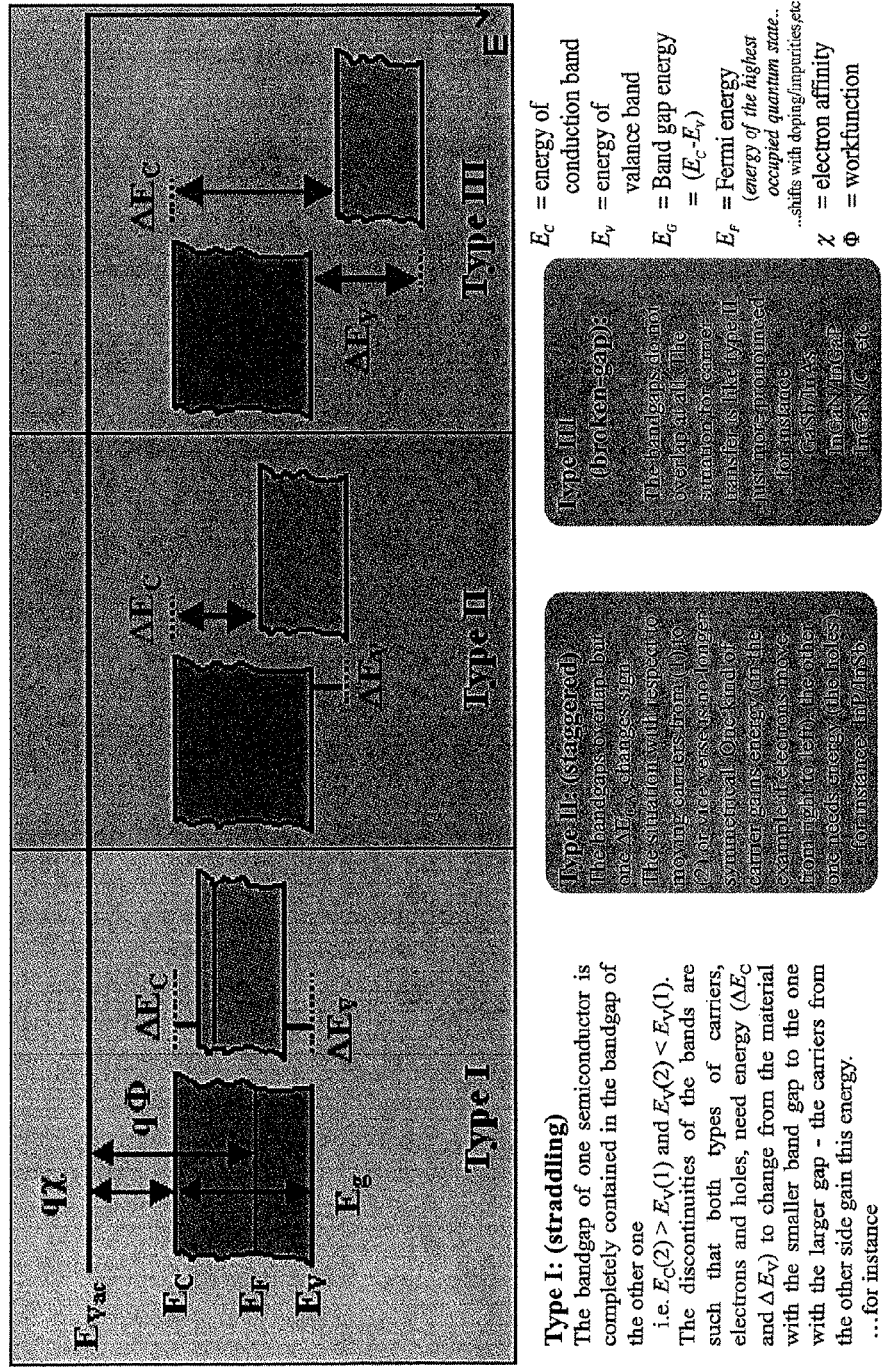
FIG. 4 illustrates the types of band alignments in type-I, type-II, and type-III (IT3) heterostructures.
Figure 5:
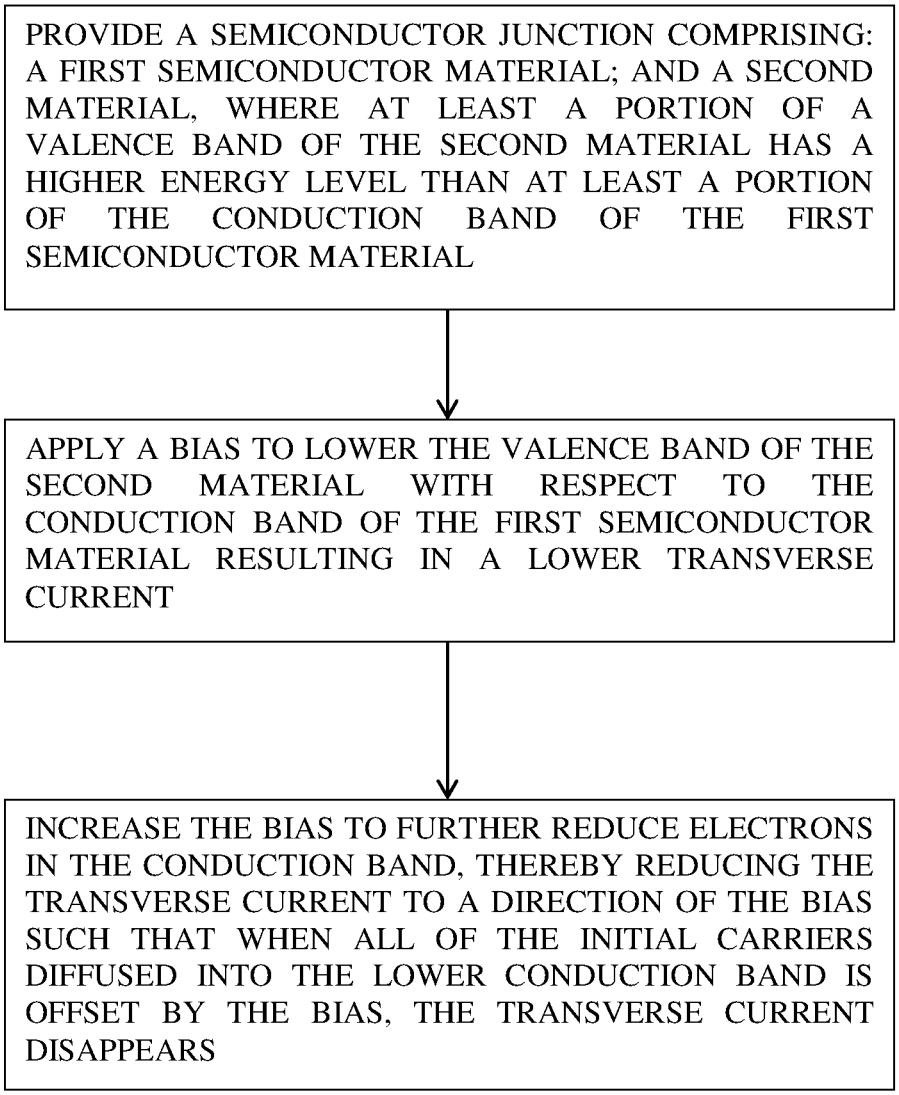
FIG. 5 illustrates a method according to one embodiment of the present application.

The traditional method of impurity doping typically results in building a threshold non-zero voltage (depending on the doping levels). At equilibrium, a depletion region is developed at the junction, giving rise to a PN junction rectifying diode configuration. In the Incoherent Type-III junction, however, equilibrium is reached when the two sides (bandgaps) are aligned, and therefore the junction possesses a zero-voltage threshold, similar to applying a voltage on a very highly doped semiconductor (including semi-metals). While PN-junctions with higher bias may reach avalanche breakdown with run-away current, the IT3 junction may achieve a negative differential conductance (NDC). This occurs when the applied voltage is sufficiently high, e.g., when $E_v^2$ moves below the occupied state of $E_c^1$, (as illustrated in FIG. 3A and FIG. 3B). In this situation, the junction current is cutoff. Hence, a negative differential conductance exists in the region, which may result in gain to the semiconducting junction (and hence devices fabricated therefrom). This phenomena results from Bloch oscillation (See Esaki & Tsu, IBM Res. & Develop., 14, 61 (1970)); the negative differential conductance (NDC) in the IT3 junction stems from current cutoff when the applied voltage lowers the valence band below the overlapping conduction band. Thus, IT3 junctions give rise to another important function as a semiconducting device; namely, that the NDC can result in both oscillation and gain of the undoped junction.

The diffusive carrier transport over the "GAIN-2DIL" interface is due to the decoherence of the electronic wavefunction of free carrier electrons. In particular, over short distances an electron wavefunction may maintain its coherence (specifically, phase coherence). In this situation, quantum mechanical motion and behavior may be expected. This may manifest itself in a number of ways, including the proclivity of an electron to tunnel across a given potential (i.e., junction). The phase coherence may also give rise to quantum mechanical electron-electron or electron lattice interactions. In an incoherent structure, the dimensions are chosen such that a given electron wavefunction is in a quantum mechanically "decohered," or quasi-classical state over the extent of the structure. In this state, free carriers (electrons/holes) may be expected to move diffusively through the structure, in a manner more analogous to fluids or heat. This diffusive motion does not limit frequency response of incoherency-based devices, however, since collision frequency may still be quite high.

In some embodiments, two model systems are employed to illustrate the physical principles involved, and to demonstrate the impact on future group III-nitride based electronic devices, in addition to potential improvements to existing group III-nitride based optoelectronics and next-generation magneto-optical structures.

Figure 2:
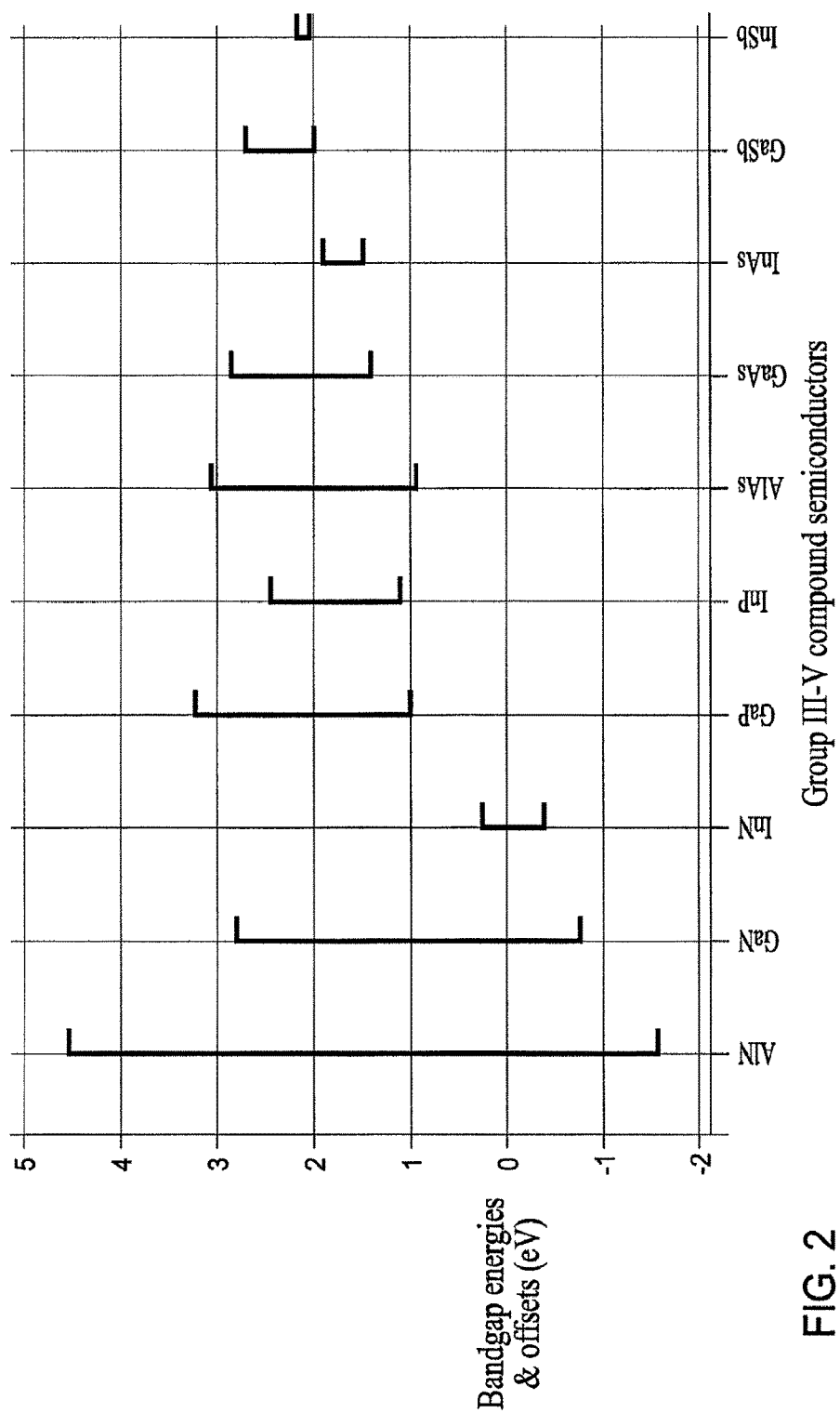
FIG. 2 illustrates bandgaps and offsets in selected group III-V compound semiconductors.

The first model system focuses on indium-rich $In_{1-x}Ga_xN$ ($0 \leq x \leq 0.2$) heterostructures or multiple quantum well (MQW) structures (GAIN) with embedded 2D-interlayers (2DILs) formed by a very thin $In_{1-x}Ga_xP$ ($0 \leq x \leq 0.6$) interlayers/delta-layers. As depicted in FIGS. 2 and 3a, the conduction band of InN and indium-rich $In_{1-x}Ga_xN$ alloys are well below the valance band maxima of the compound semiconductors InP and GaP. This allows the formation of $In_{1-x}Ga_xN/In_{1-x}Ga_xP$ structures with an expressly engineered transfer of electrons from the valence band to the conduction band of InN. The resulting charge transfer from the 2DIL valence band of the GAIN conduction band depends on proximity and orientation of the $In_{1-x}Ga_xN$ multiple quantum wells (MQWs) as well as the thickness of the sandwiched $In_{1-x}Ga_xP$ interlayer.

The compositions of $In_{1-x}Ga_xN$ and $In_{1-x}Ga_xP$ may be engineered for relatively small strain, such that the bottom of the conduction band of $In_{1-x}Ga_xN$ is below the top of the valence band of $In_{1-x}Ga_xP$, forming an IT3 band alignment. By varying the thicknesses of the $In_{1-x}Ga_xN$ MQWs (between, say, 20-5000 Å) and the 2-D $In_{1-x}Ga_xP$ interlayers (between, say, 3-500 Å), the interaction of the overlapping conduction/valence band can result in new, narrow gap system.

For a superlattice (SL) layer thicknesses much larger than 10 nm, the coherence length (or electron mean-free-path) is less than the thicknesses in question. In this case, there will not be a coherent quantum mechanical interaction, and the interface becomes incoherent (as described above). Consequently, the electrons can diffuse from the valence band into the adjacent conduction band, forming a semi-metallic "2D-interlayer" (2DIL) similar to Bismuth, graphite, or various 2D metal-/transition-metal oxides or dichalcogenides, explored for the realization of two-dimensional electron gases. The layer represented by the conduction band (with electrons from the adjacent valence band) is similar to a highly doped n-type semiconductor, while within the layer represented by the valence band, upon losing the electrons to the conduction band of the adjacent layer, may behave like the typical highly doped p-type semiconductor. In this way, a p-n junction is formed without the need for extrinsic charged carrier doping.

Having the same voltage applied to both layers, the layer behaving as if it were n-type would have a current defined by negatively charged electrons, while the layer behaving as if it were p-type would have a current defined by a positive charge.

In general, the highly conducting regions are preferably used in-between the metallic wires and individual devices to avoid the formation of Schottky barriers. Thus, IT3 junctions may serve as connections to devices, while individually avoiding the formation of Schottky barriers.

A complete theory of incoherent carrier transfer and its experimental validation is still an area of active research. Future developments are expected to refine theoretical predictions for the exact thicknesses for each layer in the superlattice (SL) structure, a critical parameter in optimizing incoherency-based devices. However, ultra-thin dissimilar "GAIN-2DIL-GAIN" structures have already demonstrated the speed advantage of having a short diffusion length, which will be of great practical importance to future high-frequency response devices. This realization may be most readily observed in a series-to-parallel analogy: a three-superlattice (SL) structure, in series, invariably has a slower frequency response than a three-superlattice (SL) structure in parallel. This is a consequence of a longer path length (3:1), and thus three in parallel will necessarily have the faster frequency response. In both cases, the thickness of each is more than the mean-free-path (region of coherence)

of the carrier, defining the IT3 case, which is subject of various embodiments described herein.

The coherent type-III case was first introduced as energy bandgap by design in the late 1970's, and has been recognized and developed aggressively, particularly for InAs/GaSb based IR detector structures. The translation of the coherent type-III case to InGaN/InGaP superlattices (SLs) can be explored in the limit where the InGaP valence band is above that of the InGaN conduction band. This architecture may still lead to new device elements. However, embodiments disclosed herein introduce the asymmetric insertion of 2D-interlayers into group III-Nitride materials structures/systems to form IT3 superlattices (SLs), which is completely unique.

In addition, the IT3 superlattice (SL) case (SL thicknesses>10 nm) has not as yet been recognized as potentially having important applications to high current devices with carrier concentrations well beyond the normal solid solubility limit for doping. It should be emphasized, therefore, that this IT3 alignment can indeed be further explored in the pursuit of high current electronics, where the carrier transport would be 2D in nature with a carrier mobility limited only by material properties. Such high mobility is due to the lack of impurity scattering from dopants, since the free carries are generated via interfacial charge transfers, rather than doping. The important and unique point of this concept is that no extrinsic dopants are involved are involved, and very sharp 2-dimensional (2D) free carrier transport channels can be inserted in vertical integrated device structures. Further, the high level of conducting carriers in IT3 junctions may be used to fill in the range of operation in between metallic and traditionally doped semiconductors. This concept allows the exploration new avenues in materials integration and system design/engineering:
- the formation of interfacial 2D p-n junction without the need to introduce external dopants,
- the control of the 2DIL conductivity and free carrier concentrations through external fields,
- the extraction of free carrier (electrons/holes) currents through interlayers with separate contacts at the end of the elements, and
- the generation/recombination of electron/hole pairs at spatially controlled interfaces, as opposed to elongated channels/regions.

The second model system illustrates additional physical principles addressed in further embodiments. In particular, in addition to the concepts discussed above, some presently encountered problems that limit the formation of ternary/quaternary group III-nitride alloys and interfaces are related to:
a) Interfacial piezoelectric polarization effects, and
b) The lattice-mismatch between the binaries InN-GaN-AlN, which leads to significant compositionally induced lattice strain in quantum well (QW) heterostructures as well as lateral spinodal decomposition, resulting in the formation of extended defects. These defects can severely affect the system integration and resulting device performance.

The incorporation of strain-relaxing 2D-interlayers are of significant interest in the integration of dissimilar group III-nitrides (e.g. SLs and MQWs) by reducing/controlling interfacial dipole fields and lattice-mismatch induced extended defects, which limits present device quality and performance. Significant research is currently being conducted to addresses problems related to the fabrication of semiconductor alloys (in particular, ternary group III-nitrides, such as InGaN or AlInN) having vastly different partial pressures. A partial pressure mismatch may lead to significantly different growth surface chemistries at similarly mismatched growth temperatures. As a result, ternary $In_{1-x}Ga_xN$ ternary alloys are unstable under standard growth conditions, and demonstrate a tendency to cluster, lateral spinodal decomposition at the growth surface, or exhibit phase separation. These phenomena may induce localized states in the InGaN layers, and can limiting the formation of highly efficient blue and green InGaN multiple quantum wells (MQW). The large differences in the tetrahedral covalent radii between InN and GaN, 2.154 Å vs. 1.944 Å, respectively, induces strain that can lead either to the formation of particular sublattices (phase separations), or to an atomic ordering within the sublattice, resulting in a deviation from homogeneity (nanoclustering). Accordingly, ongoing research continues to explore potential avenues to address and overcome the difficulties associated with phase stability, stoichiometric fluctuations and growth temperature differences between the group III-nitride binaries. In particular, advances employing super-atmospheric MOCVD growth or migration-enhanced and plasma-assisted metalorganic chemical vapor deposition (MEPA-MOCVD) for the growth of InGaN epilayers and heterostructures have made important inroads.

These growth techniques are motivated by the same intent to stabilize the growth surface by either thermodynamic or by kinetics means, both controlling the sensitive relationship between the properties of compounds and their native defect chemistry. The thermodynamic controlled growth at super-atmospheric reactor pressures has shown that the native defect density depends on the control of compound stoichiometry, that is, on the partial pressure of volatile constituents in thermal equilibrium. Recent advances in the hollow cathode plasma source development and their utilization in MEPA-MOCVD growth of InGaN epilayers indicate that the kinetic stabilization of the growth surface is an equivalent, viable approach, with potential additional degrees of freedom in the process parameter space to further stabilize the growth surface.

In light of the various challenges encountered in the group III-nitride materials integration and device design/development, the second model system, described above, illustrates an additional physical principal regarding how the insertion of 2D-graphite (often also denoted as graphene or graphene-like) Monolayers (MLs) into GAIN (e.g. gallium-rich $Ga_{1-x}In_xN$ MQWs with compositions of $0 \leq x \leq 0.3$ and thickness of 20-1000 Å) may not only form IT3 device structures, but also allow the tailoring/control of:
- lattice-strain and strain relaxation,
- interfacial dipole fields,
- carrier spin control/injection (e.g. in Gd, Mn doped layers), and
- charge carrier transport/diffusion as function of GaInN composition, 2D-graphite interlayer and GAIN thicknesses.

Returning to the first model system, periodically inserted 2DIL based in 2D-graphite interlayers embedded into GAIN may lead to unique IT3 SL structures, with tailored band alignments as function of composition. 2DILs based on 2D-graphite are by themself highly conductive, but their band alignment with respect to the GAIN structure requires additional study. In some embodiments, two purposes are claimed with respect of "GAIN-2DIL-GAIN" structures: the formation of IT3 superlattice (SL) structures, as well as the interfacial property control (e.g. lattice-strain relaxation and interfacial dipole control). In the case of graphite based 2DILs, the 2D-graphite serves a dual purpose: the 2D-graphite interface supplies electrons to the adjacent InGaN layers, and the left over electrons from the sp$^3$ orbital with sp$^2$ bonding provides "hooks" to the two adjacent vertical InGaN layers, with a poor vertical conductivity between graphite-GaInN. Graphite on most semiconductors is almost ohmic, as the graphite Fermi level is close to the conduction band of most semiconductors. Accordingly, a motivation exists to explore indium-rich InGaN/gallium-rich GaInN MQWs alloys, which allow charge transfer from the 2D-graphite monolayers (MLs) into the conduction band of indium-rich InGaN, but not in the higher bandgap GaInN. This configuration may lead to a similar arrangement as the IT3 superlattice (SL) arrangement discussed for the first model system, with added system functionalities and physical properties/benefits provided by wide bandgap group III-nitrides such as polarization effects.

The fundamental physical principles proposed herein are in tailored material structures, where the arrangement and integration of dissimilar compound semiconductor alloys lead to IT3 materials/device structures, as well as interfacial structural and physical property control. While physical principles of the invention can be illustrated with the two model system given above, the following information may be helpful in understanding and optimizing the growth and refinement of such structures, the analysis of the associated physical properties (e.g. structural, electrical, optical, interfacial polarization, etc.), and band alignment:

the free carrier charge transfer between $Ga_{1-x}In_xN$ MQWs and 2D-graphite interlayers, or various 2D metal-/transition-metal oxides or dichalcogenides that lead to IT3 interfaces when embedded in GAIN, the formation/embedding of metal-like interlayers that can be explored as conductive tunnel junctions, as well as metal-like interlayers in nanophotonic/plasmonic device structures, the band alignments between $Ga_{1-x}In_xN$ and 2D-interlayers as function of engineered overlapping conduction and valence bands, the ability to form abrupt epitaxial group III-nitride interfaces with engineered charge transfer characteristics/properties, the optical and electric confinement of embedded superlattice structures, and induced nonlinearities in adjacent QW/SL structures separated by 2D-interlayers.

To fully understand and modulate the physical properties of "GAIN-2DIL-GAIN" interfaces as well as IT3 materials structures and device elements, the following may be helpful information:

the physical and chemical bonding configurations and "GAIN-2DIL-GAIN" interface formation, the role of group III-nitride surface polarity on the 2DIL formation and integration, the influence of interfacial polarization fields in the formation of the 2DIL and the resulting band alignment, the 2DIL interaction with interfacial dipoles and polarization fields, effects of 2DIL based in InGaP versus 2D-graphite on the lattice strain induced in GAIN based MQWs, exchange reactions that have to be considered if nitrogen and/or group III-cat-ions act as actively dopant in 2D-InGaP/2D-graphite or metal-/transition-metal oxides/dichalcogenides interlayers, the extend on how external electric and/or magnetic fields can control the conductivity in the embedded 2DILs, and how embedded 2D-InGaP/2D-graphite interlayers do effect the carrier recombination dynamics in GAIN MQWs.

It is noted that the high carrier originated via diffusion for the transfer of valence band electrons to the empty conduction band resulting in an inter-facial region with electrons is similar to the carrier transfer in a MOSFET. With the application of a bias to lower the valence band with respect to the conduction band, electrons will go back resulting in a lower transverse current. Further increase in such bias, similar to the bias that is applied to the MOSFET, will further reduce the electrons in the conduction band, and therefore, the transverse current to the direction of the bias is reduced. When all of the initial carriers diffused into the lower conduction band is offset by the bias, the transverse current will eventually disappear. This is a new sort of negative transverse conductance, to offset the initial diffusion current using a bias across the interface.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A semiconductor junction comprising:
a first semiconductor material; and
a second material;
wherein the first semiconductor material and the second material are extrinsically undoped, wherein the first semiconductor material is a group III-nitride heterostructure or group III-nitride multiple quantum well structure such that the first semiconductor material comprises $In_{1-x}Ga_xN$ wherein $0<x\leq0.2$, and the second material comprises a layer within the first semiconductor material formed by $In_{1-x}Ga_xP$ wherein $0<x\leq0.6$, so that a broken-gap band alignment is formed between the first semiconductor material and the second material, and
wherein at least a portion of a valence band of the second material has a higher energy level than at least a portion of a conduction band of the first semiconductor material such that an interface between the first semiconductor material and the second material creates a flow of a majority of carriers across the semiconductor junction that is diffusive, and the interface of the first semiconductor material and the second material is configured such that a region of generation or recombination of a plurality of the carriers is confined to a two-dimensional surface of the second material.

2. The semiconductor junction of claim 1, wherein the first semiconductor material is between 1-500 nm thick, and the second material is no more than 100 monolayers thick.

3. The semiconductor junction of claim 1, wherein the first semiconductor material is a ternary or quaternary group III-nitride.

4. The semiconductor junction of claim 1, wherein the second material is a layer of graphite or metal-/transition-metal oxides or dichalcogenides.

5. The semiconductor junction of claim 1, wherein the first material has an aperiodic superlattice structure.

6. The semiconductor junction of claim 1, wherein the second material is a layer disposed between the first semiconductor material and a third material, the third material forming a layer between the second material and a fourth material.

7. The semiconductor junction of claim 1, wherein confinement of the carriers at the semiconductor junction is a confinement of type-III carriers.

8. The semiconductor junction of claim 1, wherein confinement of the carriers leads to surface plasmon generation and propagation conditions in a spectral range, acting as photonic emitter, a detector, or an interconnect.

9. A method comprising :
   providing a semiconductor junction comprising:
   a first semiconductor material; and
   a second material, wherein the first semiconductor material is a group III- nitride heterostructure or group III-nitride multiple quantum well structure such that the first semiconductor material comprises $In_{1-x}Ga_xN$ wherein $0<x\le0.2$, and the second material comprises a layer within the first semiconductor material formed by $In_{1-x}Ga_xP$ wherein $0<x\le0.6$, so that a broken-gap band alignment is formed between the first semiconductor material and the second material, and wherein at least a portion of a valence band of the second material has a higher energy level than at least a portion of a conduction band of the first semiconductor material;
   applying a bias to lower the valence band of the second material with respect to the conduction band of the first semiconductor material resulting in a transverse current lower than prior to applying the bias; and
   increasing the bias to further reduce electrons in the conduction band, thereby reducing the transverse current to a direction of the bias such that when carriers that are diffused into the conduction band is offset by the bias, the transverse current disappears.

* * * * *